(12) United States Patent
Lee et al.

(10) Patent No.: US 11,891,022 B2
(45) Date of Patent: Feb. 6, 2024

(54) RAINDROP SENSOR DEVICE AND DRIVING METHOD THEREOF

(71) Applicant: Au Optronics Corporation, Hsinchu (TW)

(72) Inventors: Chia-Chi Lee, Hsinchu (TW); Pao-Yu Huang, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 373 days.

(21) Appl. No.: 17/386,500

(22) Filed: Jul. 27, 2021

(65) Prior Publication Data

US 2022/0111821 A1 Apr. 14, 2022

Related U.S. Application Data

(60) Provisional application No. 63/090,330, filed on Oct. 12, 2020.

(30) Foreign Application Priority Data

Apr. 8, 2021 (TW) ................................. 110112663

(51) Int. Cl.
*B60S 1/08* (2006.01)
*H01L 33/38* (2010.01)
*H01L 33/62* (2010.01)

(52) U.S. Cl.
CPC ............ *B60S 1/0837* (2013.01); *H01L 33/38* (2013.01); *H01L 33/62* (2013.01); *B60S 1/0825* (2013.01)

(58) Field of Classification Search
CPC .... B60S 1/0837; B60S 1/0825; B60S 1/0822; B60S 1/0859; H01L 33/38; H01L 33/62; H01L 25/167; G01W 1/14
USPC .................................................. 318/483, 445
See application file for complete search history.

(56) References Cited

U.S. PATENT DOCUMENTS

| | | | | |
|---|---|---|---|---|
| 4,973,844 | A * | 11/1990 | O'Farrell | B60S 1/0822 250/341.7 |
| 7,019,322 | B2 * | 3/2006 | Sautter | B60S 1/0837 340/602 |
| 9,234,983 | B2 * | 1/2016 | Sugiura | B60S 1/0837 |
| 9,371,032 | B2 | 6/2016 | Veerasamy | |
| 9,542,023 | B2 | 1/2017 | Lukanc et al. | |
| 9,552,089 | B2 | 1/2017 | Lukanc et al. | |
| 2015/0042599 | A1 | 2/2015 | Lukanc et al. | |

(Continued)

FOREIGN PATENT DOCUMENTS

| | | |
|---|---|---|
| CN | 202563207 | 11/2012 |
| CN | 104460411 | 3/2015 |
| CN | 204789597 | 11/2015 |

(Continued)

*Primary Examiner* — David Luo
(74) *Attorney, Agent, or Firm* — JCIPRNET

(57) ABSTRACT

A raindrop sensor device, including a substrate, a raindrop sensor element, a first light emitting diode, and an active element, is provided. The raindrop sensor element is located on the substrate and includes a first electrode and a second electrode separated from each other. The first light emitting diode is located on the substrate and is electrically connected to the first electrode. The first electrode and the second electrode are closer to the substrate than the active element. The active element is located on the substrate and is electrically connected to the first light emitting diode.

15 Claims, 13 Drawing Sheets

(56) References Cited

U.S. PATENT DOCUMENTS

2015/0042600 A1  2/2015  Lukanc et al.

FOREIGN PATENT DOCUMENTS

| CN | 105556446 | 5/2016 |
| CN | 110459567 | 11/2019 |
| CN | 211617631 | 10/2020 |

* cited by examiner

RAINDROP SENSOR DEVICE AND DRIVING METHOD THEREOF

CROSS-REFERENCE TO RELATED APPLICATION

This application claims the priority benefit of U.S. Provisional Application No. 63/090,330, filed on Oct. 12, 2020 and Taiwan application serial no. 110112663, filed on Apr. 8, 2021. The entirety of each of the above-mentioned patent applications is hereby incorporated by reference herein and made a part of this specification.

BACKGROUND

Technical Field

The disclosure relates to a raindrop sensor device and a driving method thereof.

Description of Related Art

When driving a vehicle on a rainy day, raindrops on the windshield will obstruct the line of sight of the driver and seriously affect driving safety. Generally speaking, when driving a vehicle, the driver will use wipers to remove raindrops on the windshield. However, if the rain intensity suddenly increases during the process of driving the vehicle, the driver may not have time to increase the speed of the wipers removing the raindrops, which causes the line of sight to be obstructed. In order to prevent the driver from having a traffic accident due to obstructed line of sight, an apparatus that can detect changes in the rain intensity in real time is currently needed.

SUMMARY

The disclosure provides a raindrop sensor device, which has both a raindrop sensing function and a display function and saves circuit layout space.

The disclosure provides a driving method of a raindrop sensor device. The raindrop sensor device used has both a raindrop sensing function and a display function and saves circuit layout space.

At least one embodiment of the disclosure provides a raindrop sensor device. The raindrop sensor device includes a substrate, a raindrop sensor element, a first light emitting diode, and an active element. The raindrop sensor element is located on the substrate and includes a first electrode and a second electrode separated from each other. The first light emitting diode is located on the substrate and is electrically connected to the first electrode of the raindrop sensor element. The first electrode and the second electrode are closer to the substrate than the active element. The active element is located on the substrate and is electrically connected to the first light emitting diode.

At least one embodiment of the disclosure provides a raindrop sensor device. The raindrop sensor device includes a substrate, a raindrop sensor element, a light emitting diode, and an active element. The raindrop sensor element is located on the substrate and includes a first electrode and a second electrode separated from each other. The light emitting diode is electrically connected to the first electrode of the raindrop sensor element, and the first electrode and the second electrode are closer to the substrate than the active element. The active element is electrically connected to the light emitting diode. A driving method of the raindrop sensor device includes the following steps. The raindrop sensor device is provided, a raindrop sensing mode of the raindrop sensor device is executed, and a display mode of the raindrop sensor device is executed. The raindrop sensing mode includes applying a first pulse signal to the raindrop sensor device. The display mode includes applying a second pulse signal to the active element.

DETAILED DESCRIPTION OF DISCLOSED EMBODIMENTS

Figure 1A:
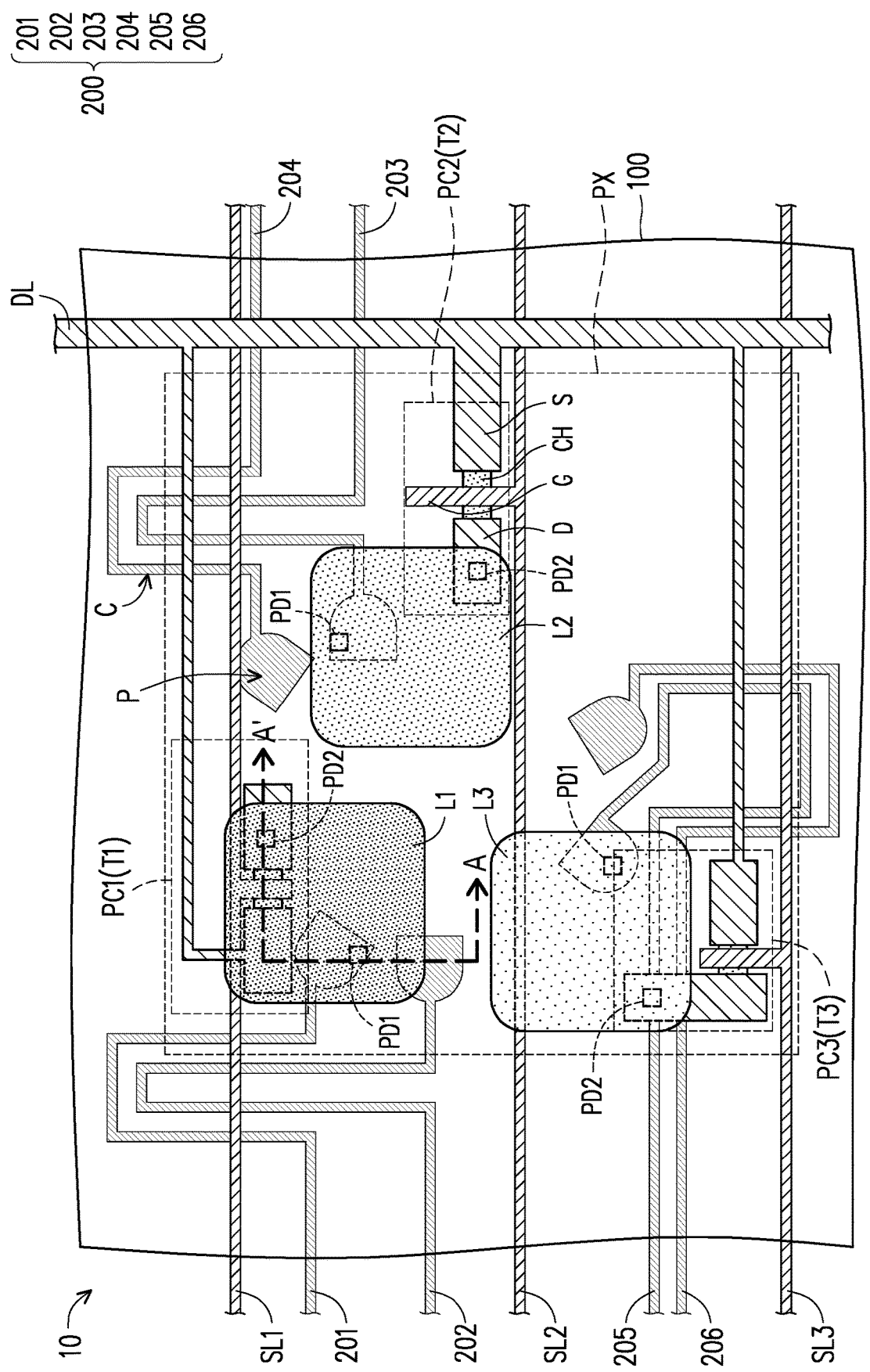
FIG. 1A is a schematic top view of a raindrop sensor device according to an embodiment of the disclosure.
Figure 1B:
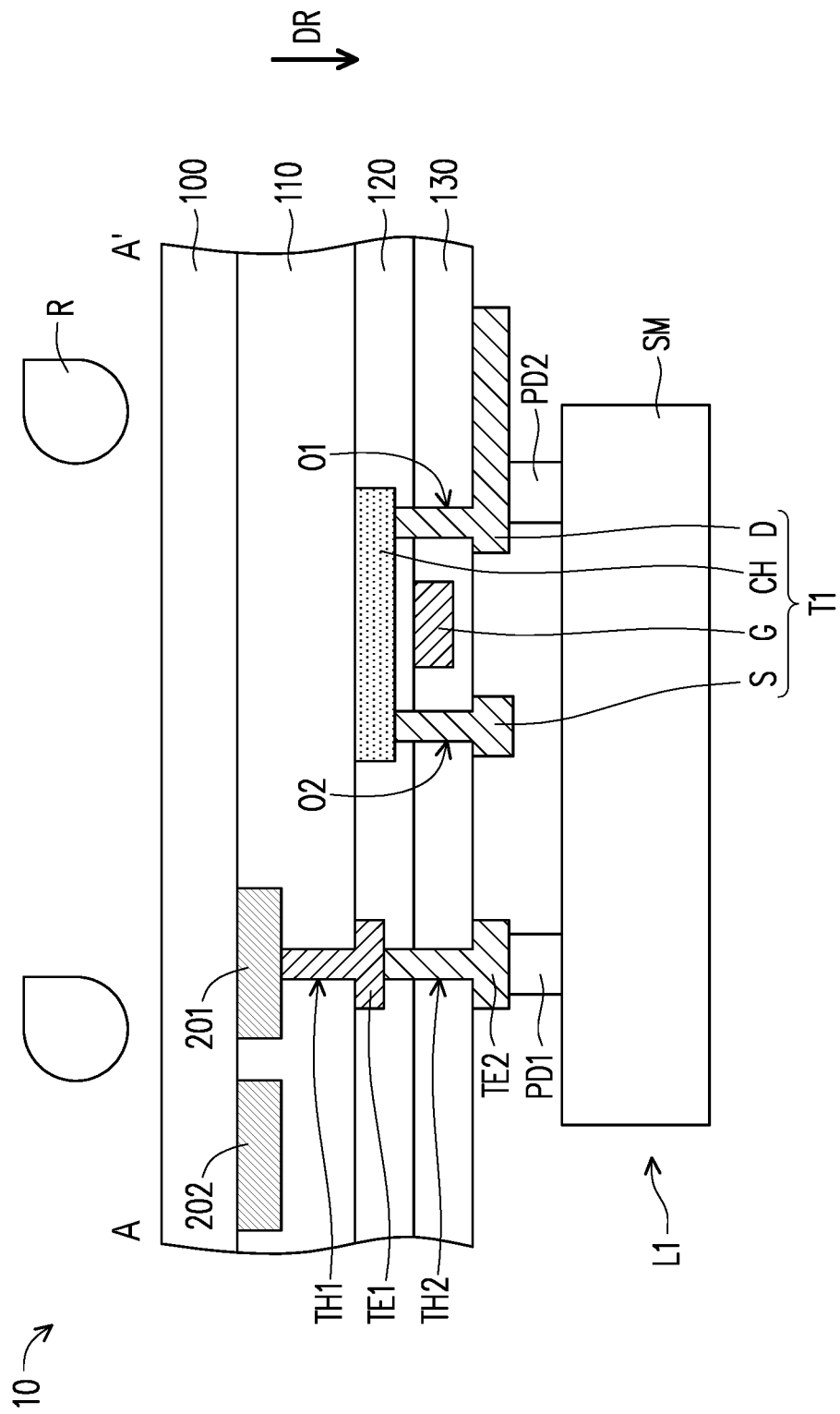
FIG. 1B is a schematic cross-sectional view taken along a line A-A' of FIG. 1A.

FIG. 1A is a schematic top view of a raindrop sensor device according to an embodiment of the disclosure. FIG. 1B is a schematic cross-sectional view taken along a line A-A' of FIG. 1A.

Please refer to FIG. 1A and FIG. 1B. A raindrop sensor device 10 includes a substrate 100, a raindrop sensor element 200, a first light emitting diode L1, and a first subpixel control circuit PC1. In the embodiment, the raindrop sensor device 10 further includes a second light emitting diode L2, a third light emitting diode L3, a second subpixel control circuit PC2, and a third subpixel control circuit PC3.

In the embodiment, the first subpixel control circuit PC1, the second subpixel control circuit PC2, and the third subpixel control circuit PC3 respectively include a first active element T1, a second active element T2, and a third active element T3, but the disclosure is not limited thereto. In other embodiments, each of the first subpixel control circuit PC1, the second subpixel control circuit PC2, and the third subpixel control circuit PC3 may also include other active elements and/or passive elements. In other words, the disclosure does not limit each of the first subpixel control circuit PC1, the second subpixel control circuit PC2, and the third subpixel control circuit PC3 to include only one active element.

The material of the substrate 100 may be glass, quartz, organic polymer, or other applicable materials. In some embodiments, the substrate 100 is suitable for a windshield of transportation means.

The raindrop sensor element 200 is located on the substrate 100 and includes a first electrode 201 and a second electrode 202 separated from each other. In the embodiment, the raindrop sensor device 10 further includes a third electrode 203, a fourth electrode 204, a fifth electrode 205, and a sixth electrode 206. The third electrode 203 and the fourth electrode 204 are separated from each other, and the fifth electrode 205 and the sixth electrode 206 are separated from each other. In some embodiments, the first electrode 201, the second electrode 202, the third electrode 203, the fourth electrode 204, the fifth electrode 205, and the sixth electrode 206 belong to the same conductive layer, and the material is a transparent conductive material, such as indium tin oxide, indium zinc oxide, aluminum tin oxide, aluminum zinc oxide, indium gallium zinc oxide, or a stacked layer of at least two of the above. In the embodiment, each of the first electrode 201, the second electrode 202, the third electrode 203, the fourth electrode 204, the fifth electrode 205, and the sixth electrode 206 includes a pad P and a wire C. The width of the pad P is greater than the width of the wire C.

In the embodiment, a raindrop R affects an electric field (or capacitance) between the first electrode 201 and the second electrode 202, an electric field (or capacitance) between the third electrode 203 and the fourth electrode 204, and/or an electric field (or capacitance) between the fifth electrode 205 and the sixth electrode 206. The magnitude of the rain intensity may be known by changes in the electric field.

A first insulating layer 110 (not shown in FIG. 1A) is located on the substrate 100 and the first electrode 201, the second electrode 202, the third electrode 203, the fourth electrode 204, the fifth electrode 205, and the sixth electrode 206 of the raindrop sensor element 200. The first active element T1, the second active element T2, and the third active element T3 are located on the first insulating layer 110.

Each of the first active element T1, the second active element T2, and the third active element T3 includes a channel layer CH, a gate G, a source S, and a drain D.

The channel layer CH is located on the first insulating layer 110. A gate insulating layer 120 (not shown in FIG. 1A) is located on the channel layer CH. The gate G is located on the gate insulating layer 120 (not shown in FIG. 1A) and overlaps with the channel layer CH. A second insulating layer 130 is located on the gate insulating layer 120 and the gate G. The drain D and the source S are located on the second insulating layer 130 and are electrically connected to the channel layer CH through opening O1 and O2 (not shown in FIG. 1A). The openings O1 and O2, for example, penetrate the second insulating layer 130 (not shown in FIG. 1A) and the gate insulating layer 120.

In the embodiment, the first active element T1, the second active element T2, and the third active element T3 are top gate thin film transistors, but the disclosure is not limited thereto. According to other embodiments, the first active element T1, the second active element T2, and the third active element T3 are bottom gate thin film transistors, double gate thin film transistors, or other types of thin film transistors.

In the embodiment, the gates G of the first active element T1, the second active element T2, and the third active element T3 are respectively electrically connected to a first scanning line SL1, a second scanning line SL2, and a third scanning line SL3, and the sources S of the first active element T1, the second active element T2, and the third active element T3 are electrically connected to a data line DL at the same time, but the disclosure is not limited thereto.

In other embodiments, the gates G of the first active element T1, the second active element T2, and the third active element T3 are electrically connected to a scanning line at the same time, and the sources S of the first active element T1, the second active element T2, and the third active element T3 are respectively electrically connected to different data lines.

The first light emitting diode L1, the second light emitting diode L2, and the third light emitting diode L3 are located on the substrate 100. In the embodiment, the first light emitting diode L1, the second light emitting diode L2, and the third light emitting diode L3 are located on the second insulating layer 130. The drains D of the first active element T1, the second active element T2, and the third active element T3 are respectively electrically connected to the first light emitting diode L1, the second light emitting diode L2, and the third light emitting diode L3. The first light emitting diode L1, the second light emitting diode L2, and the third light emitting diode L3 are, for example, micro-light emitting diodes (LEDs), mini-LEDs, organic LEDs, or other suitable LEDs. In the embodiment, the first light emitting diode L1, the second light emitting diode L2, and the third light emitting diode L3 are located in the same pixel PX of the raindrop sensor device 10, and the first light emitting diode L1, the second light emitting diode L2, and the third light emitting diode L3 are respectively LEDs with different colors, for example, a green light emitting diode, a red light emitting diode, and a blue light emitting diode. In some embodiments, the first light emitting diode L1, the second light emitting diode L2, and the third light emitting diode L3 are suitable for displaying driving information to a driver in a vehicle or other people outside the vehicle.

In the embodiment, the first light emitting diode L1, the second light emitting diode L2, and the third light emitting diode L3 are located on the same side of the substrate 100 as the raindrop sensor element 200, for example, an inner side that is not directly exposed to the raindrop R. In some embodiments, the first light emitting diode L1, the second light emitting diode L2, and the third light emitting diode L3 emit light outwards (for example, emit light toward the substrate 100) to display information to drivers of other vehicles or passers-by outside the vehicle, but the disclosure is not limited thereto. In other embodiments, the first light emitting diode L1, the second light emitting diode L2, and the third light emitting diode L3 emit light inwards (for example, emit light against the substrate 100) to display information to the driver in the vehicle.

In the embodiment, each of the first light emitting diode L1, the second light emitting diode L2, and the third light emitting diode L3 includes a semiconductor SM, a first pad PD1, and a second pad PD2. The semiconductor SM has, for example, a multilayer structure. The first pad PD1 and the second pad PD2 are electrically connected to the semiconductor SM. The first pads PD1 of the first light emitting diode L1, the second light emitting diode L2, and the third light emitting diode L3 are respectively electrically connected to the first electrode 201, the third electrode 203, and the fifth electrode 205 of the raindrop sensor element 200. The second pads PD2 of the first light emitting diode L1, the second light emitting diode L2, and the third light emitting diode L3 are respectively electrically connected to the drains D of the first active element T1, the second active element T2, and the third active element T3.

In the embodiment, the raindrop sensor device 10 also includes multiple first transfer electrodes TE1 (not shown in FIG. 1A) and multiple second transfer electrodes TE2 (not shown in FIG. 1A). The first pads PD1 of the first light emitting diode L1, the second light emitting diode L2, and the third light emitting diode L3 are respectively electrically connected to the first electrode 201, the third electrode 203, and the fifth electrode 205 of the raindrop sensor element 200 through the corresponding first transfer electrodes TE1 and the corresponding second transfer electrodes TE2. In the embodiment, the first transfer electrodes TE1 are located on the first insulating layer 110 and are respectively electrically connected to the first electrode 201, the third electrode 203, and the fifth electrode 205 of the raindrop sensor element 200 through multiple first through holes TH1 (not shown in FIG. 1A) passing through the first insulating layer 110. The gate insulating layer 120 is located on the first transfer electrode TE1. The second transfer electrodes TE2 are located on the second insulating layer 130 and are electrically connected to the corresponding first transfer electrodes TE1 through multiple second through holes TH2 (not shown in FIG. 1A) passing through the second insulating layer 130. In the embodiment, the second through holes TH2 pass through the second insulating layer 130 and the gate insulating layer 120. The first pad PD1 of each of the first light emitting diode L1, the second light emitting diode L2, and the third light emitting diode L3 is electrically connected to the corresponding second transfer electrode TE2. In other words, the first light emitting diode L1, the second light emitting diode L2, and the third light emitting diode L3 are respectively electrically connected to the first electrode 201, the third electrode 203, of and the fifth electrode 205 of the raindrop sensor element 200 through the second transfer electrodes TE2 and the first transfer electrodes TE1.

In the embodiment, the first electrode 201, the second electrode 202, the third electrode 203, the fourth electrode 204, the fifth electrode 205, and the sixth electrode 206 of the raindrop sensor element 200 are closer to the substrate 100 than the first active element T1, the second active element T2, and the third active element T3, so as to prevent signals of the raindrop R from being shielded by the first subpixel control circuit PC1, the second subpixel control circuit PC2, and the third subpixel control circuit PC3. In the embodiment, the first electrode 201, the second electrode 202, the third electrode 203, the fourth electrode 204, the fifth electrode 205, and the sixth electrode 206 of the raindrop sensor element 200 are closer to the substrate 100 than the first light emitting diode L1, the second light emitting diode L2, and the third light emitting diode L3, so as to prevent the signals of the raindrop R from being shielded by the first light emitting diode L1, the second light emitting diode L2, and the third light emitting diode L3.

In the embodiment, the first electrode 201, the first pad PD1 of the first light emitting diode L1, the third electrode 203, the first pad PD1 of the second light emitting diode L2, the fifth electrode 205, and the first pad PD1 of the third light emitting diode L3 are all electrically connected to a ground signal. Therefore, by electrically connecting the first pad PD1 of the first light emitting diode L1 to the first electrode 201, electrically connecting the first pad PD1 of the second light emitting diode L2 to the third electrode 203, and electrically connecting the first pad PD1 of the third light emitting diode L3 to the fifth electrode 205, circuit layout space is saved. In some embodiments, in a direction DR perpendicular to the substrate 100, the first electrode 201 partially overlaps with the first light emitting diode L1, the third electrode 203 partially overlaps with the second light emitting diode L2, and the fifth electrode 205 partially overlaps with the third light emitting diode L3.

In the embodiment, the raindrop sensor device 10 has both a raindrop sensing function and a display function.

Figure 2:
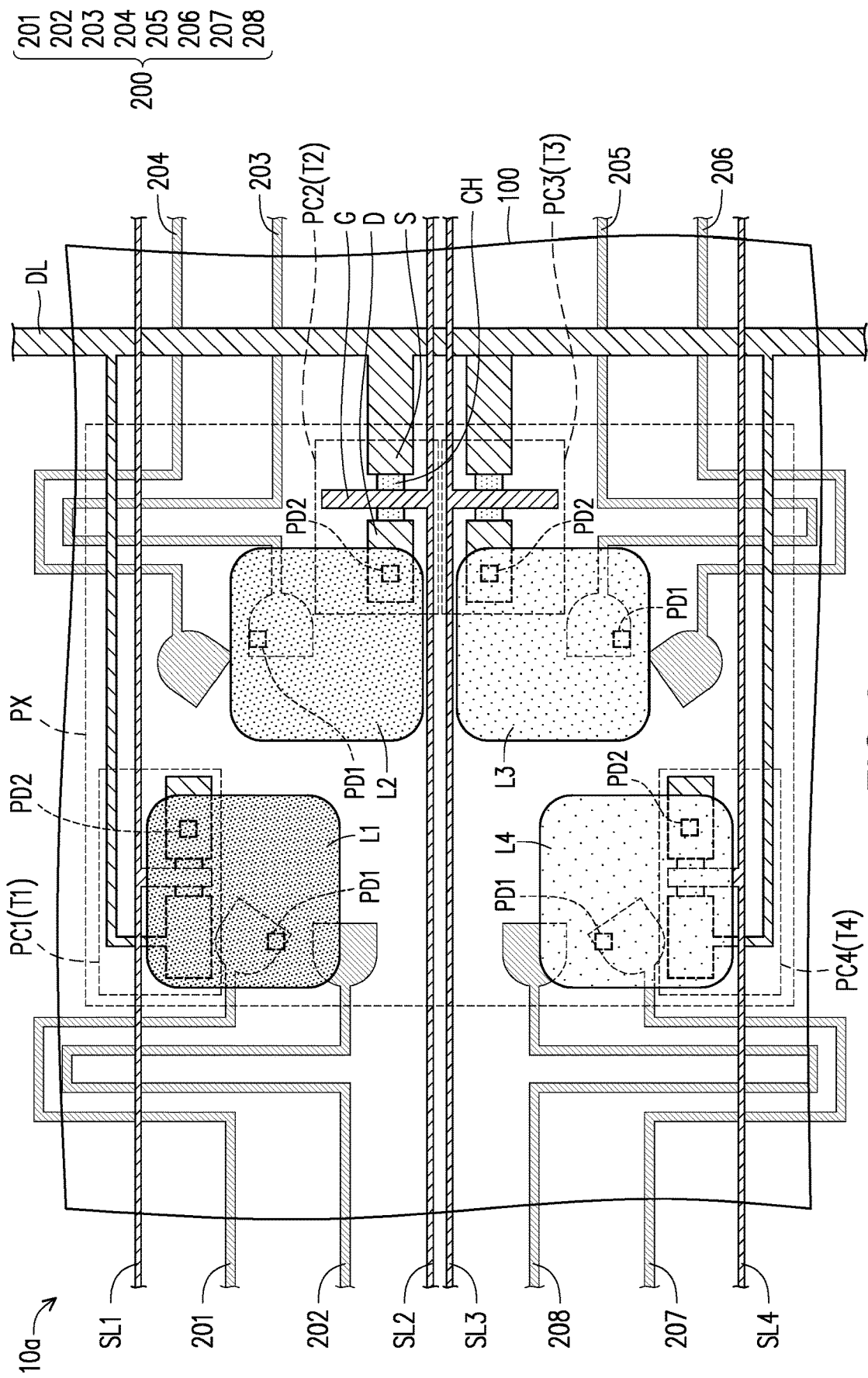
FIG. 2 is a schematic top view of a raindrop sensor device according to an embodiment of the disclosure.

FIG. 2 is a schematic top view of a raindrop sensor device according to an embodiment of the disclosure. It must be noted here that the embodiment of FIG. 2 continues to use the reference numerals and some content of the embodiment of FIG. 1A and FIG. 1B, wherein the same or similar reference numerals are adopted to represent the same or similar elements, and the description of the same technical content is omitted. For the description of the omitted parts, reference may be made to the foregoing embodiment, which will not be repeated here.

The difference between a raindrop sensor device 10a of FIG. 2 and the raindrop sensor device 10 of FIG. 1A is that: in the raindrop sensor device 10a of FIG. 2, the same pixel PX has the first light emitting diode L1, the second light emitting diode L2, the third light emitting diode L3, and a fourth light emitting diode L4. The fourth light emitting diode L4 is, for example, a white light emitting diode, a yellow light emitting diode, or a light emitting diode with other colors.

In the embodiment, the raindrop sensor device 10a further includes a fourth subpixel control circuit PC4 and the fourth light emitting diode L4. The fourth subpixel control circuit PC4 includes a fourth active element T4, and the drain D of the fourth active element T4 is electrically connected to the second pad PD2 of the fourth light emitting diode L4. In the embodiment, a raindrop sensor element 200a further includes a seventh electrode 207 and an eighth electrode 208. The seventh electrode 207 and the eighth electrode 208 are separated from each other. The first pad PD1 of the fourth light emitting diode L4 is electrically connected to the seventh electrode 207.

In the embodiment, the gates G of the first active element T1, the second active element T2, the third active element T3, and the fourth active element T4 are respectively electrically connected to the first scanning line SL1, the second scanning line SL2, the third scanning line SL3, and a fourth scanning line SL4.

In the embodiment, the sources S of the first active element T1, the second active element T2, the third active element T3, and the fourth active element T4 are electrically connected to the same data line DL.

In the embodiment, the raindrop sensor device 10a has both the raindrop sensing function and the display function.

Figure 3A:
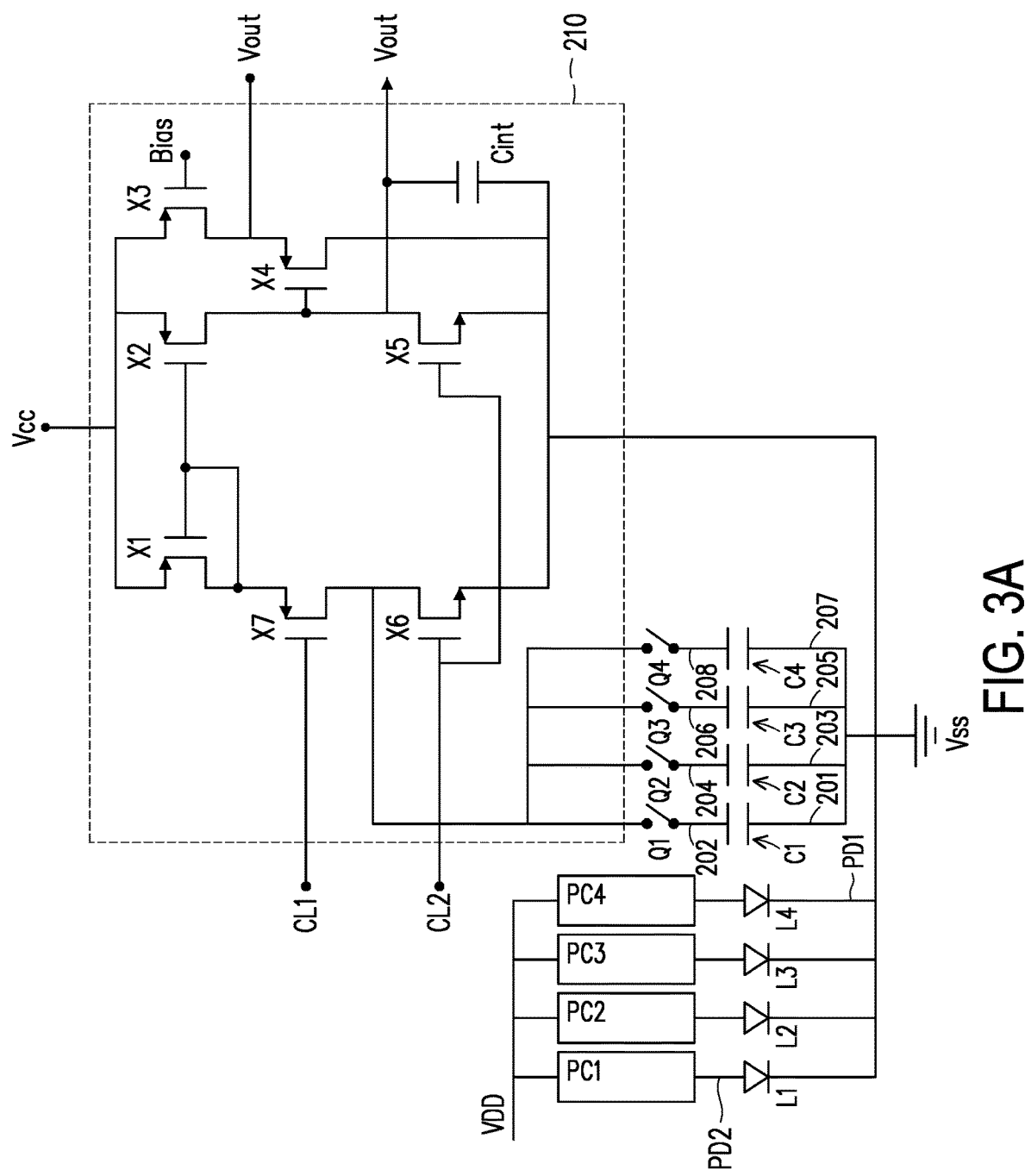
FIG. 3A is a schematic view of a circuit of a raindrop sensor device according to an embodiment of the disclosure.
Figure 3B:
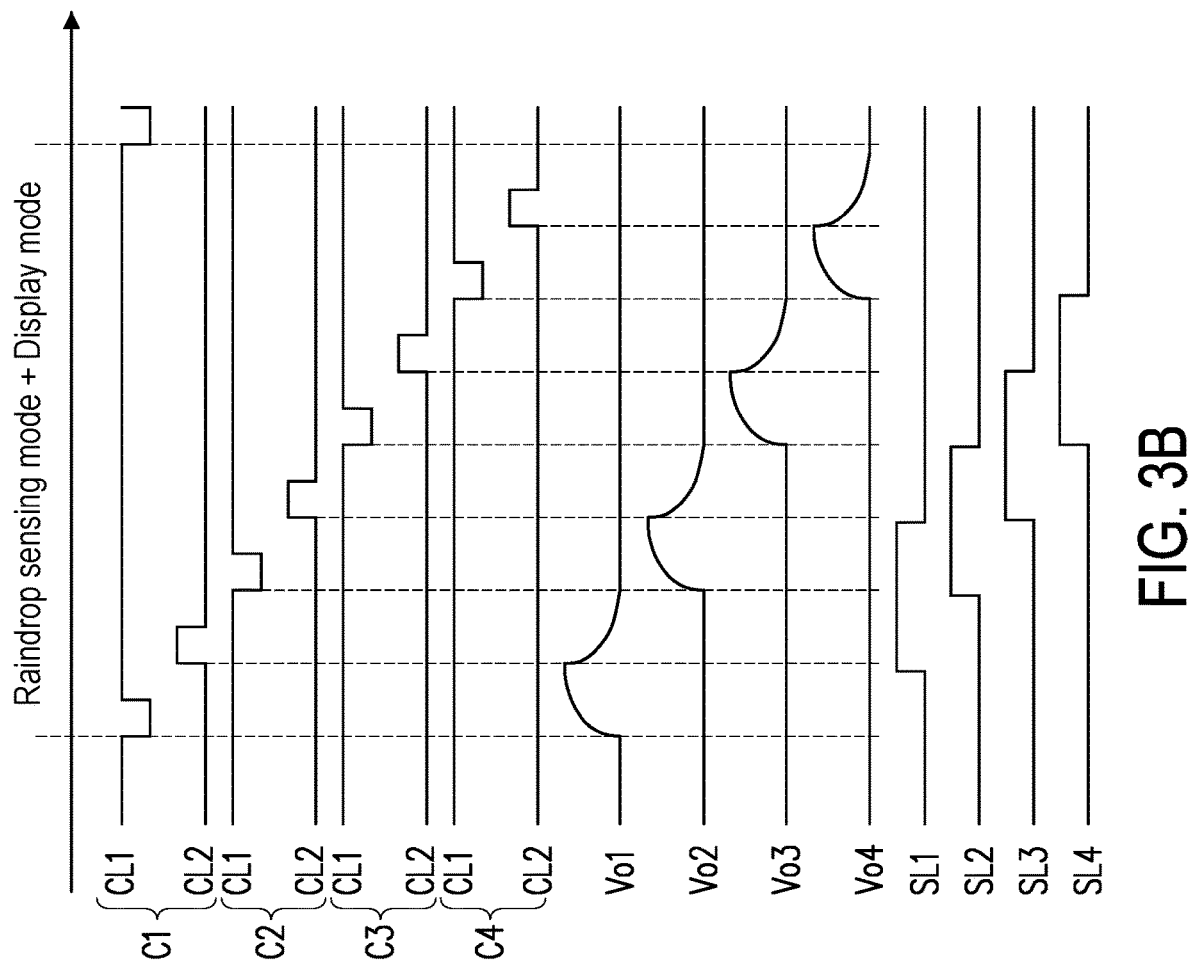
FIG. 3B is a timing view of a driving method of a raindrop sensor device according to an embodiment of the disclosure.

FIG. 3A is a schematic view of a circuit of a raindrop sensor device according to an embodiment of the disclosure. FIG. 3B is a timing view of a driving method of a raindrop sensor device according to an embodiment of the disclosure. The raindrop sensor device corresponding to FIG. 3A and FIG. 3B is, for example, the raindrop sensor device 10a of FIG. 2.

Please refer to FIG. 2 and FIG. 3A. In the embodiment, a raindrop sensor element 200a further includes a control circuit 210 (not shown in FIG. 2). The control circuit 210 is, for example, formed on the substrate 100.

In the embodiment, a capacitor C1 includes the first electrode 201 and the second electrode 202. The first electrode 201 of the capacitor C1 is electrically connected to the first pad PD1 of the first light emitting diode L1, and the second electrode 202 of the capacitor C1 is electrically connected to the control circuit 210 when a switch Q1 is in a closed state (ON). A capacitor C2 includes the third electrode 203 and the fourth electrode 204. The third electrode 203 of the capacitor C2 is electrically connected to the first pad PD1 of the second light emitting diode L2, and the fourth electrode 204 of the capacitor C2 is electrically connected to the control circuit 210 when a switch Q2 is in the closed state (ON). A capacitor C3 includes the fifth electrode 205 and the sixth electrode 206. The fifth electrode 205 of the capacitor C3 is electrically connected to the first pad PD1 of the third light emitting diode L3, and the sixth electrode 206 of the capacitor C3 is electrically connected to the control circuit 210 when a switch Q3 is in the closed state (ON). A capacitor C4 includes the seventh electrode 207 and the eighth electrode 208. The seventh electrode 207 of the capacitor C4 is electrically connected to the first pad PD1 of the fourth light emitting diode L4, and the eighth electrode 208 of the capacitor C4 is electrically connected to the control circuit 210 when a switch Q4 is in the closed state (ON).

In some embodiments, the control circuit 210 includes transistors X1 to X7. In some embodiments, the transistors X1, X2, and X7 are p-type metal-oxide-semiconductor field-effect transistors. The transistors X5 and X6 are n-type metal-oxide-semiconductor field-effect transistors.

Please refer to FIG. 3A and FIG. 3B. In the embodiment, a raindrop sensing mode of the raindrop sensor device 10a is executed. The raindrop sensing mode includes a write phase and an erase phase.

In the write phase, a pulse signal CL1 is applied to the transistor X7 of the raindrop sensor device 10a to charge one or more of the capacitors C1 to C4. In the write phase, the transistors X1 and X2 are in the closed state (ON), the transistors X4, X5, and X6 are in an open state (OFF), and the transistors X3 and X4 may be selectively in the open state or the closed state. When the transistor X7 is in the closed state by the pulse signal CL1, a signal Vcc is transmitted to one or more of the capacitors C1 to C4. The switches Q1 to Q4 between the capacitors C1 to C4 and the control circuit 210 may be used to determine which one (or more) of the capacitors C1 to C4 the signal Vcc is to be transmitted to. The signal Vcc is, for example, a constant voltage signal.

In some embodiments, when the transistor X7 is in the closed state (ON), current flows into a capacitor Cint in addition to the capacitors C1 to C4. An output signal Vout may be read out by a chip or other electronic elements. The output signal Vout of FIG. 3A corresponds to output signals Vo1 to Vo4 of FIG. 3B, and the output signals Vo1 to Vo4 respectively correspond to the capacitors C1 to C4.

In the erase phase, a pulse signal CL2 is applied to the transistors X5 and X6 of the raindrop sensor device 10a to discharge the capacitors C1 to C4. In other words, the two electrodes of each of the capacitors C1 to C4 are both electrically connected to a ground voltage Vss. In the erase phase, the transistor X7 is in the open state (OFF), that is, the pulse signal CL1 is not applied to the transistor X7.

In some embodiments, when the transistors X5 and X6 are in the closed state (ON), in addition to the capacitors C1 to C4, the capacitor Cint is also discharged. The output signal Vout may be read out by a chip or other electronic elements.

Please refer to FIG. 2 and FIG. 3B. In the embodiment, a display mode of the raindrop sensor device 10a is executed. The display mode includes applying activation signals to the first active element T1, the second active element T2, the third active element T3, and the fourth active element T4. For example, the first scanning line SL1, the second scanning line SL2, the third scanning line SL3, and the fourth scanning line SL4 are used to sequentially apply the activation signals to the first active element T1, the second active element T2, the third active element T3, and the fourth active element T4.

In the embodiment, the display mode and the raindrop sensing mode of the raindrop sensor device 10a may be executed at the same time or at different times.

Figure 4:
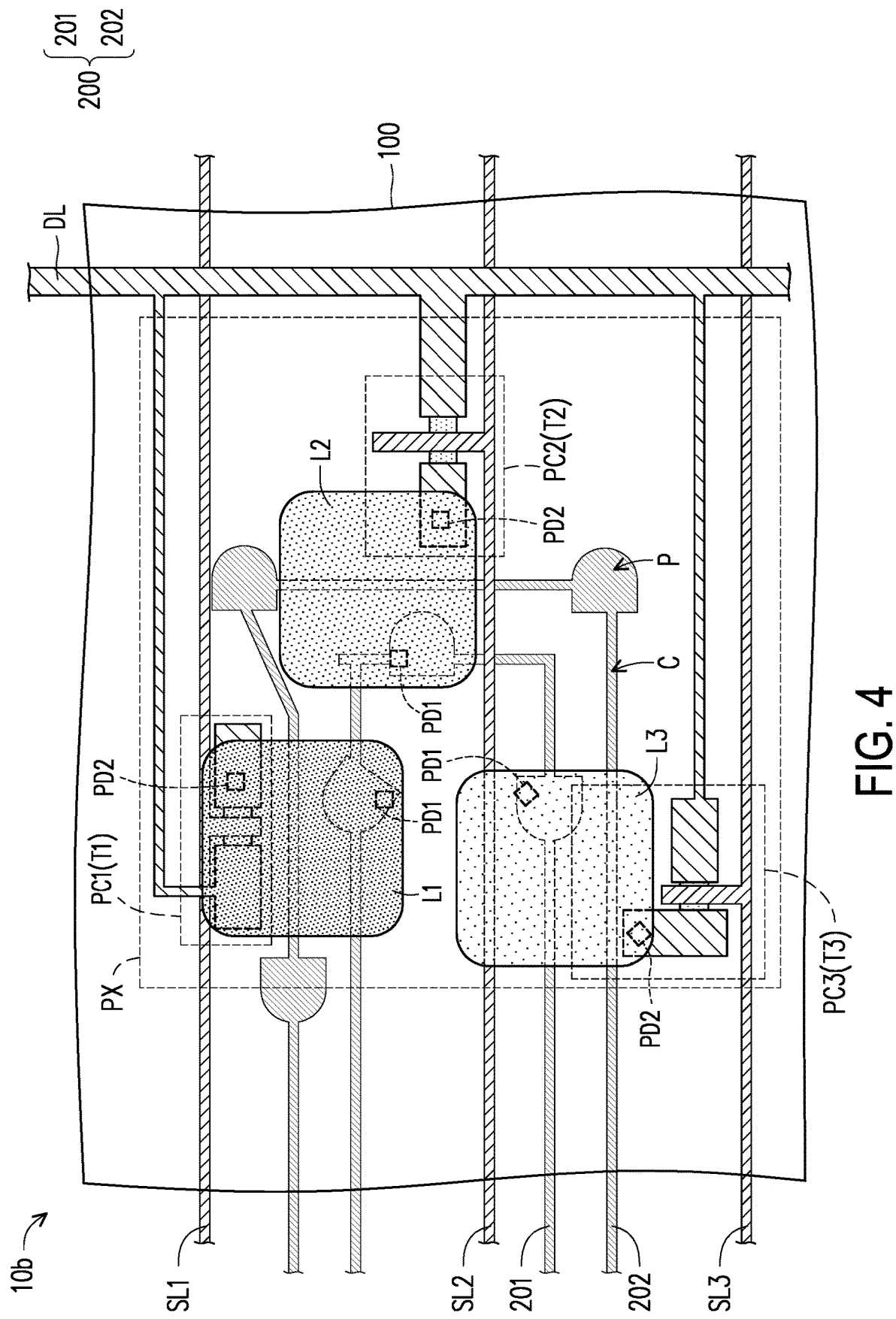
FIG. 4 is a schematic top view of a raindrop sensor device according to an embodiment of the disclosure.

FIG. 4 is a schematic top view of a raindrop sensor device according to an embodiment of the disclosure. It must be noted here that the embodiment of FIG. 4 continues to use the reference numerals and some content of the embodiment of FIG. 1A and FIG. 1B, wherein the same or similar reference numerals are adopted to represent the same or similar elements, and the description of the same technical content is omitted. For the description of the omitted parts, reference may be made to the foregoing embodiment, which will not be repeated here.

The difference between a raindrop sensor device 10b of FIG. 4 and the raindrop sensor device 10 of FIG. 1A is that: in the raindrop sensor device 10b of FIG. 4, the first light emitting diode L1, the second light emitting diode L2, and the third light emitting diode L3 are all electrically connected to the first electrode 201 of the raindrop sensor element 200.

In the embodiment, the first electrode 201 and the second electrode 202 include the pads P and the wire C electrically connected to the pads P. The width of the pad P is greater than the width of the wire C. The pad P of the first electrode 201 partially overlaps with the first light emitting diode L1, the second light emitting diode L2, and the third light emitting diode L3.

In the embodiment, the raindrop sensor device 10b has both the raindrop sensing function and the display function.

Figure 5:
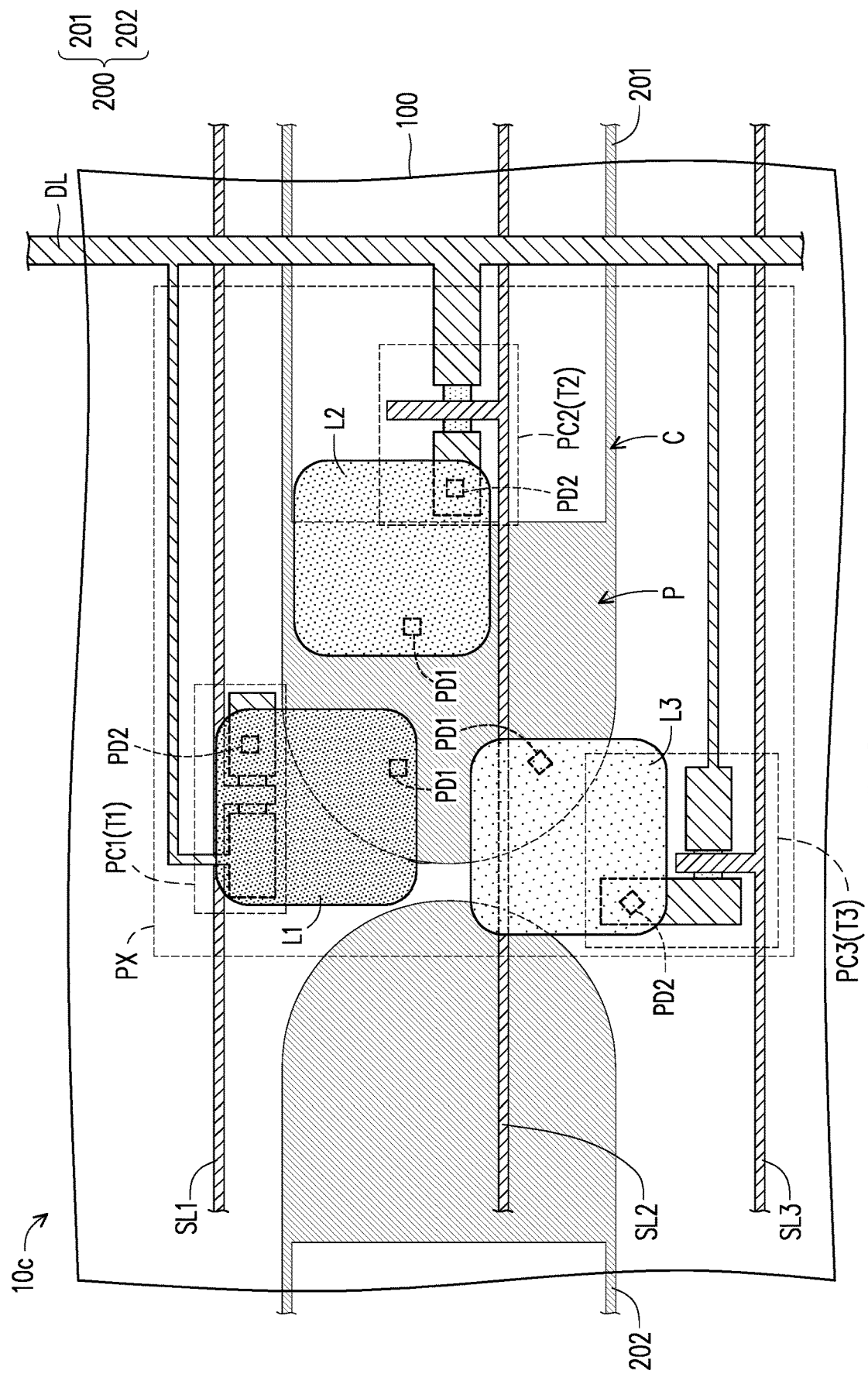
FIG. 5 is a schematic top view of a raindrop sensor device according to an embodiment of the disclosure.

FIG. 5 is a schematic top view of a raindrop sensor device according to an embodiment of the disclosure. It must be noted here that the embodiment of FIG. 5 continues to use the reference numerals and some content of the embodiment of FIG. 4, wherein the same or similar reference numerals are adopted to represent the same or similar elements, and the description of the same technical content is omitted. For the description of the omitted parts, reference may be made to the foregoing embodiment, which will not be repeated here.

The difference between a raindrop sensor device 10c of FIG. 5 and the raindrop sensor device 10b of FIG. 4 is that: in the embodiment, the size of the first electrode 201 of the raindrop sensor device 10c is greater than the size of the first light emitting diode L1, the size of the second light emitting diode L2, and the size of the third light emitting diode L3.

In the embodiment, the pad P of the first electrode 201 partially overlaps with the first light emitting diode L1, the second light emitting diode L2, and the third light emitting diode L3, and the size of the pad P is greater than the size of the first light emitting diode L1, the size of the second light emitting diode L2, and the size of the third light emitting diode L3.

In the embodiment, the raindrop sensor device 10c has both the raindrop sensing function and the display function.

Figure 6A:
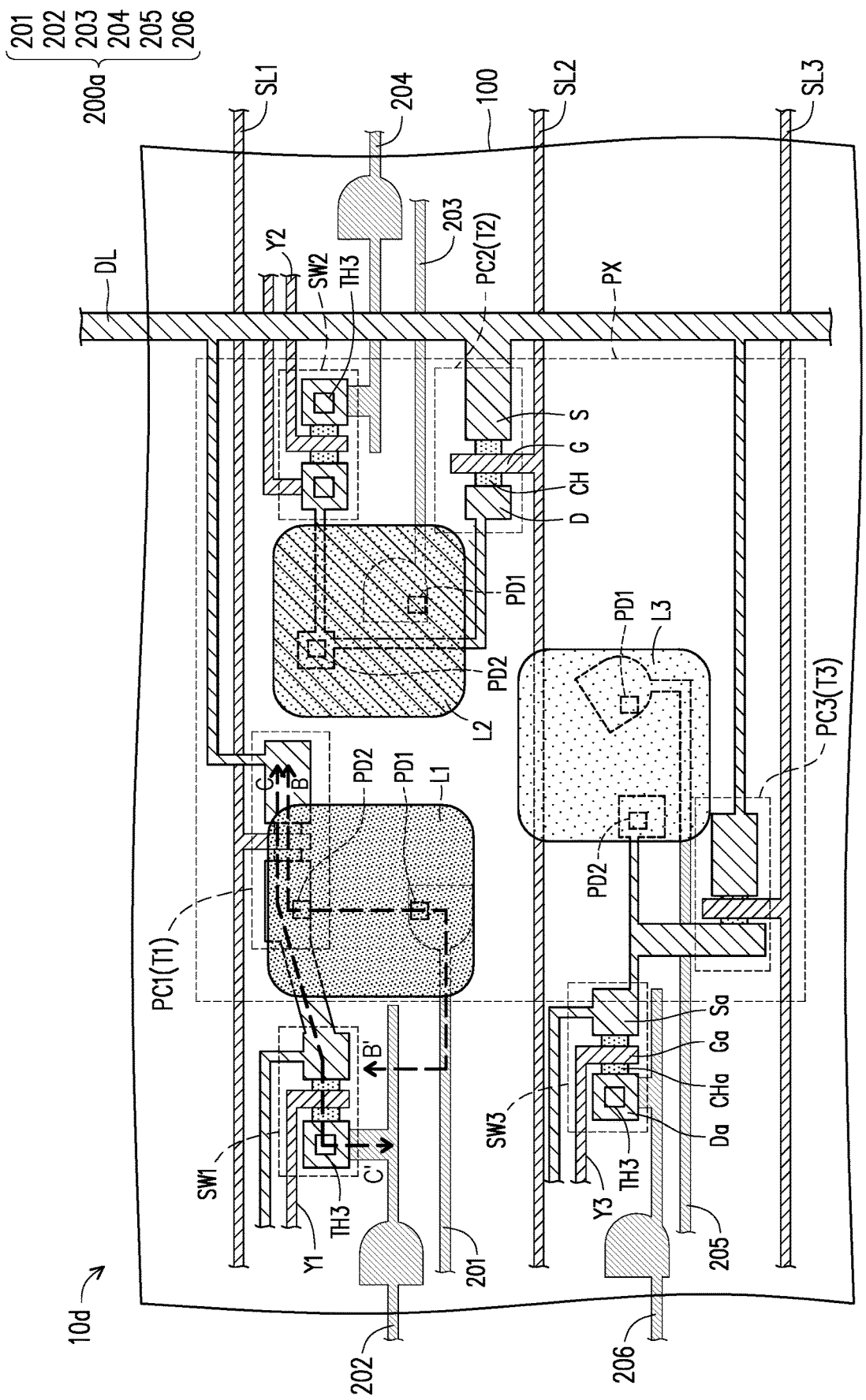
FIG. 6A is a schematic top view of a raindrop sensor device according to an embodiment of the disclosure.
Figure 6B:
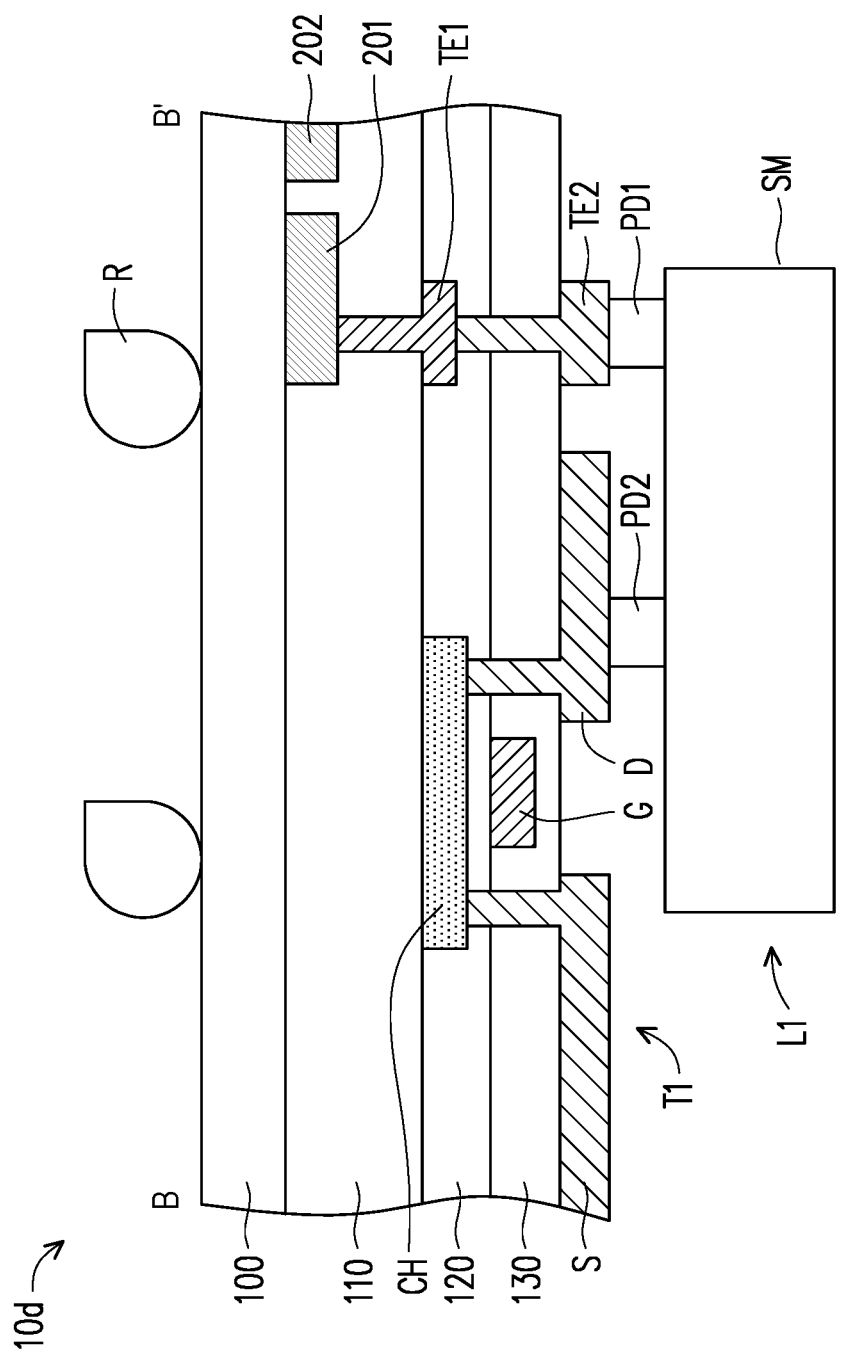
FIG. 6B is a schematic cross-sectional view taken along a line B-B' of FIG. 6A.
Figure 6C:
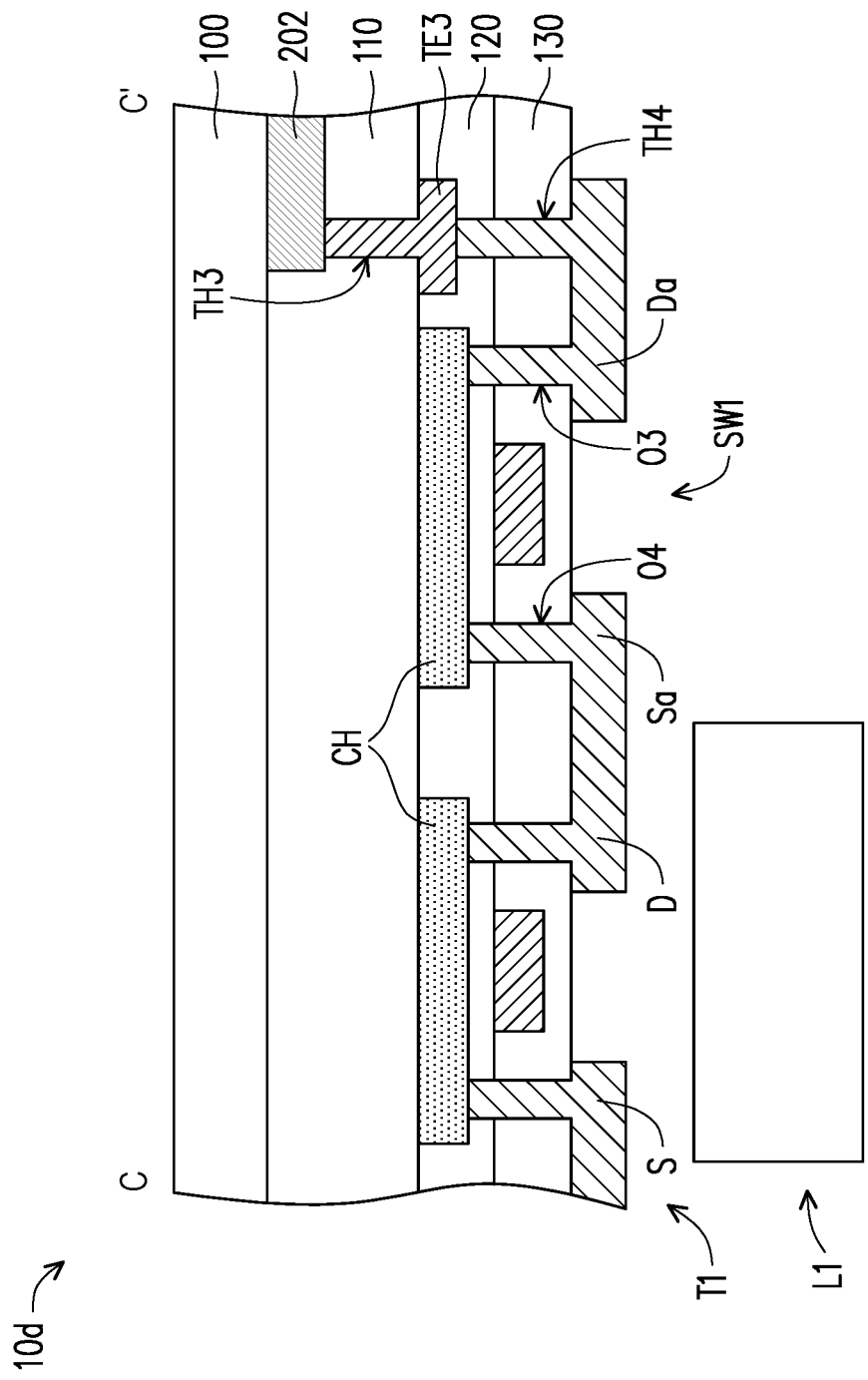
FIG. 6C is a schematic cross-sectional view taken along a line C-C' of FIG. 6A.

FIG. 6A is a schematic top view of a raindrop sensor device according to an embodiment of the disclosure. FIG. 6B is a schematic cross-sectional view taken along a line B-B' of FIG. 6A. FIG. 6C is a schematic cross-sectional view taken along a line C-C' of FIG. 6A. It must be noted here that the embodiment of FIG. 6A to FIG. 6C continues to use the reference numerals and some content of the embodiment of FIG. 1A and FIG. 1B, wherein the same or similar reference numerals are adopted to represent the same or similar elements, and the description of the same technical content is omitted. For the description of the omitted parts, reference may be made to the foregoing embodiment, which will not be repeated here.

The difference between a raindrop sensor device 10d of FIG. 6A to FIG. 6C and the raindrop sensor device 10 of FIG. 1A is that: the raindrop sensor device 10d of FIG. 6A to FIG. 6C further includes a first switch element SW1, a second switch element SW2, and a third switch element SW3.

Please refer to FIG. 6A to FIG. 6C. The first switch element SW1, the second switch element SW2, and the third switch element SW3 are located on the substrate 100. Each of the first switch element SW1, the second switch element SW2, and the third switch element SW3 includes a channel layer CHa, a gate Ga, a source Sa, and a drain Da.

The channel layer CHa is located on the first insulating layer 110 (not shown in FIG. 6A). The gate insulating layer 120 (not shown in FIG. 6A) is located on the channel layer CHa. The gate Ga is located on the gate insulating layer 120 and overlaps with the channel layer CHa. The second insulating layer 130 is located on the gate insulating layer 120 and the gate Ga. The drain Da and the source Sa are located on the second insulating layer 130 (not shown in FIG. 6A) and are electrically connected to the channel layer CHa through openings O3 and O4 (not shown in FIG. 6A). The openings O3 and O4, for example, penetrate the second insulating layer 130 and the gate insulating layer 120.

In the embodiment, the first switch element SW1, the second switch element SW2, and the third switch element SW3 are top gate thin film transistors, but the disclosure is not limited thereto. According to other embodiments, the first switch element SW1, the second switch element SW2, and the third switch element SW3 are bottom gate thin film transistors, double gate thin film transistors, or other types of thin film transistors.

In the embodiment, the gates Ga of the first switch element SW1, the second switch element SW2, and the third switch element SW3 are respectively electrically connected to a first control line Y1, a second control line Y2, and a third control line Y3.

In the embodiment, the source Sa of the first switch element SW1 is electrically connected to the drain D of the first active element T1 and the second pad PD2 of the first light emitting diode L1, the source Sa of the second switch element SW2 is electrically connected to the drain D of the second active element T2 and the second pad PD2 of the second light emitting diode L2, and the source Sa of the third switch element SW3 is electrically connected to the drain D of the third active element T3 and the second pad PD2 of the third light emitting diode L3.

In the embodiment, the drain Da of the first switch element SW1 is electrically connected to the second electrode 202 of the raindrop sensor element 200, the drain Da of the second switch element SW2 is electrically connected to the fourth electrode 204 of the raindrop sensor element 200, and the drain Da of the third switch element SW3 is electrically connected to the sixth electrode 206 of the raindrop sensor element 200. In the embodiment, the drain Da of the first switch element SW1, the drain Da of the second switch element SW2, and the drain Da of the third switch element SW3 are also electrically connected to the control circuit of the raindrop sensor element 200 (not shown in FIG. 6A). In the embodiment, multiple third transfer electrodes TE3 (not shown in FIG. 6A) are located on the first insulating layer 110 and are respectively electrically connected to the second electrode 202, the fourth electrode 204, and the sixth electrode 206 of the raindrop sensor element 200 through multiple third through holes TH3 of the first insulating layer 110. The gate insulating layer 120 is located on the third transfer electrode TE3. The drain Da of the first switch element SW1, the drain Da of the second switch element SW2, and the drain Da of the third switch element SW3 are located on the second insulating layer 130 and are respectively electrically connected to through the third transfer electrodes TE3 through multiple fourth through holes TH4 passing through the second insulating layer 130.

In the embodiment, the first switch element SW1, the second switch element SW2, and the third switch element SW3 may prevent the control circuit of the raindrop sensor element 200 in the display mode from interfering with the first light emitting diode L1, the second light emitting diode L2, and the third light emitting diode L3.

Figure 7:
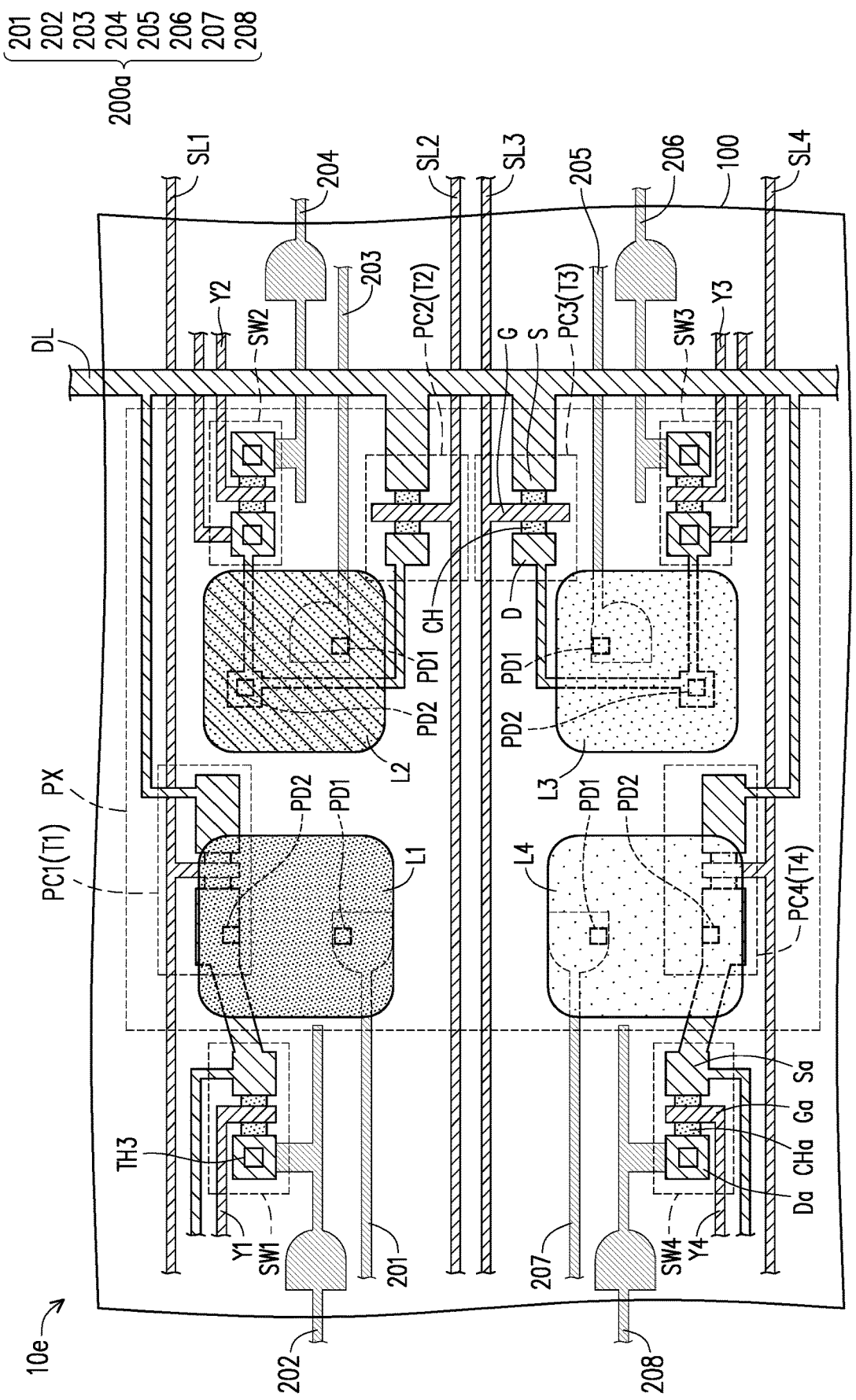
FIG. 7 is a schematic top view of a raindrop sensor device according to an embodiment of the disclosure.

FIG. 7 is a schematic top view of a raindrop sensor device according to an embodiment of the disclosure. It must be noted here that the embodiment of FIG. 7 continues to use the reference numerals and some content of the embodiment of FIG. 6A to FIG. 6C, wherein the same or similar reference numerals are adopted to represent the same or similar elements, and the description of the same technical content is omitted. For the description of the omitted parts, reference may be made to the foregoing embodiment, which will not be repeated here.

The difference between a raindrop sensor device 10e of FIG. 7 and the raindrop sensor device 10d of FIG. 6A to FIG. 6C is that: in the raindrop sensor device 10e of FIG. 7, the same pixel PX has the first light emitting diode L1, the second light emitting diode L2, the third light emitting diode L3, and the fourth light emitting diode L4. The fourth light emitting diode L4 is, for example, a white light emitting diode, a yellow light emitting diode, or a light emitting diode with other colors.

In the embodiment, the raindrop sensor device 10e further includes the fourth subpixel control circuit PC4, the fourth light emitting diode L4, and a fourth switch element SW4. The fourth subpixel control circuit PC4 includes the fourth active element T4, and the drain of the fourth active element T4 is electrically connected to the source Sa of the fourth switch element SW4 and the second pad PD2 of the fourth light emitting diode L4. In the embodiment, the raindrop sensor element 200a further includes the seventh electrode 207 and the eighth electrode 208. The seventh electrode 207 and the eighth electrode 208 are separated from each other. The first pad PD1 of the fourth light emitting diode L4 is electrically connected to the seventh electrode 207. The drain of the fourth switch element SW4 is electrically connected to the eighth electrode 208.

In the embodiment, the gates G of the first active element T1, the second active element T2, the third active element T3, and the fourth active element T4 are respectively electrically connected to the first scanning line SL1, the second scanning line SL2, the third scanning line SL3, and the fourth scanning line SL4. The gates Ga of the first switch element SW1, the second switch element SW2, the third switch element SW3, and the fourth switch element SW4 are respectively electrically connected to the first control line Y1, the second control line Y2, the third control line Y3, and the fourth control line Y4.

In the embodiment, the source S of each of the first active element T1, the second active element T2, the third active element T3, and the fourth active element T4 is electrically connected to the same data line DL.

In the embodiment, the raindrop sensor device 10e has both the raindrop sensing function and the display function.

Figure 8A:
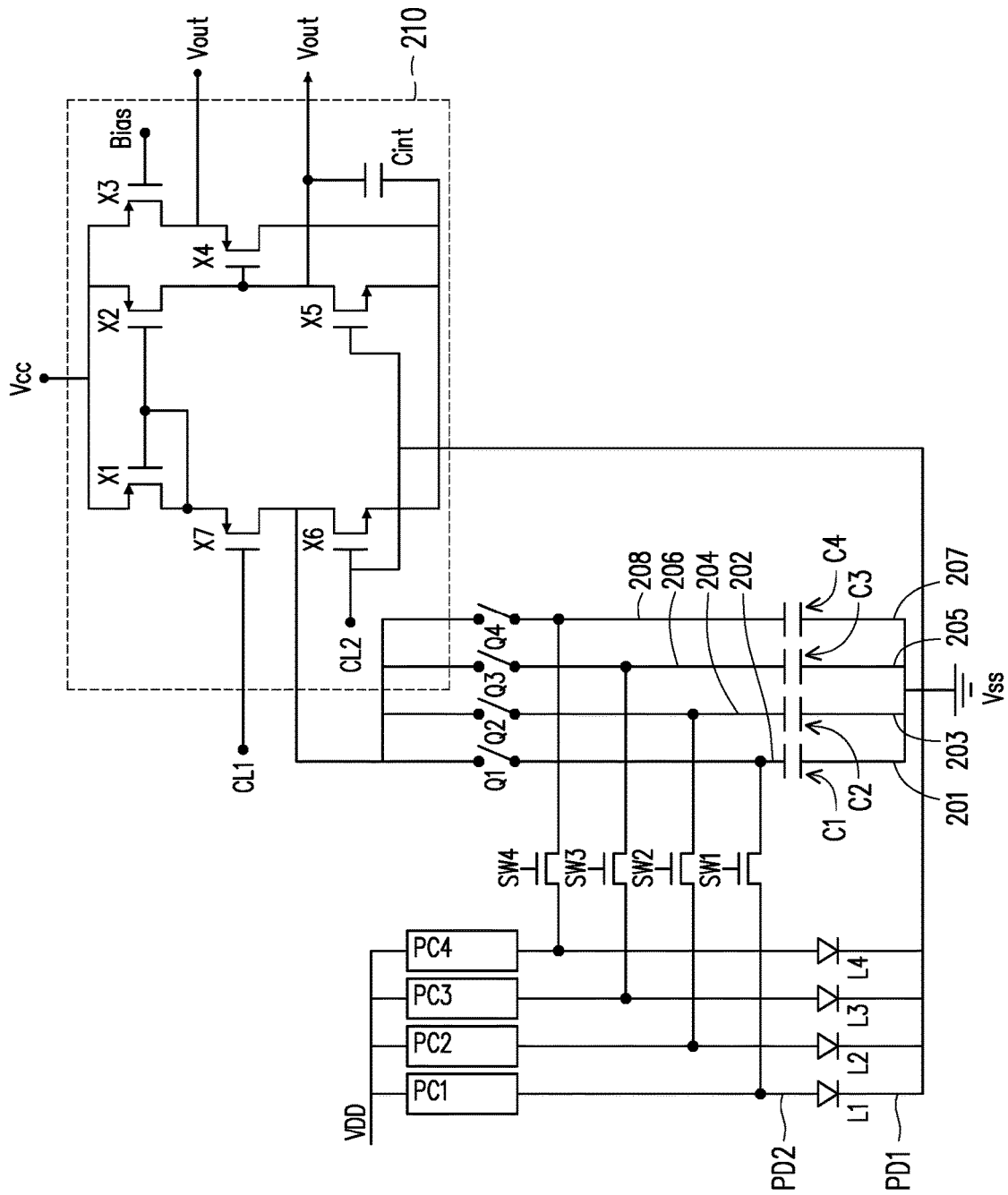
FIG. 8A is a schematic view of a circuit of a raindrop sensor device according to an embodiment of the disclosure.
Figure 8B:
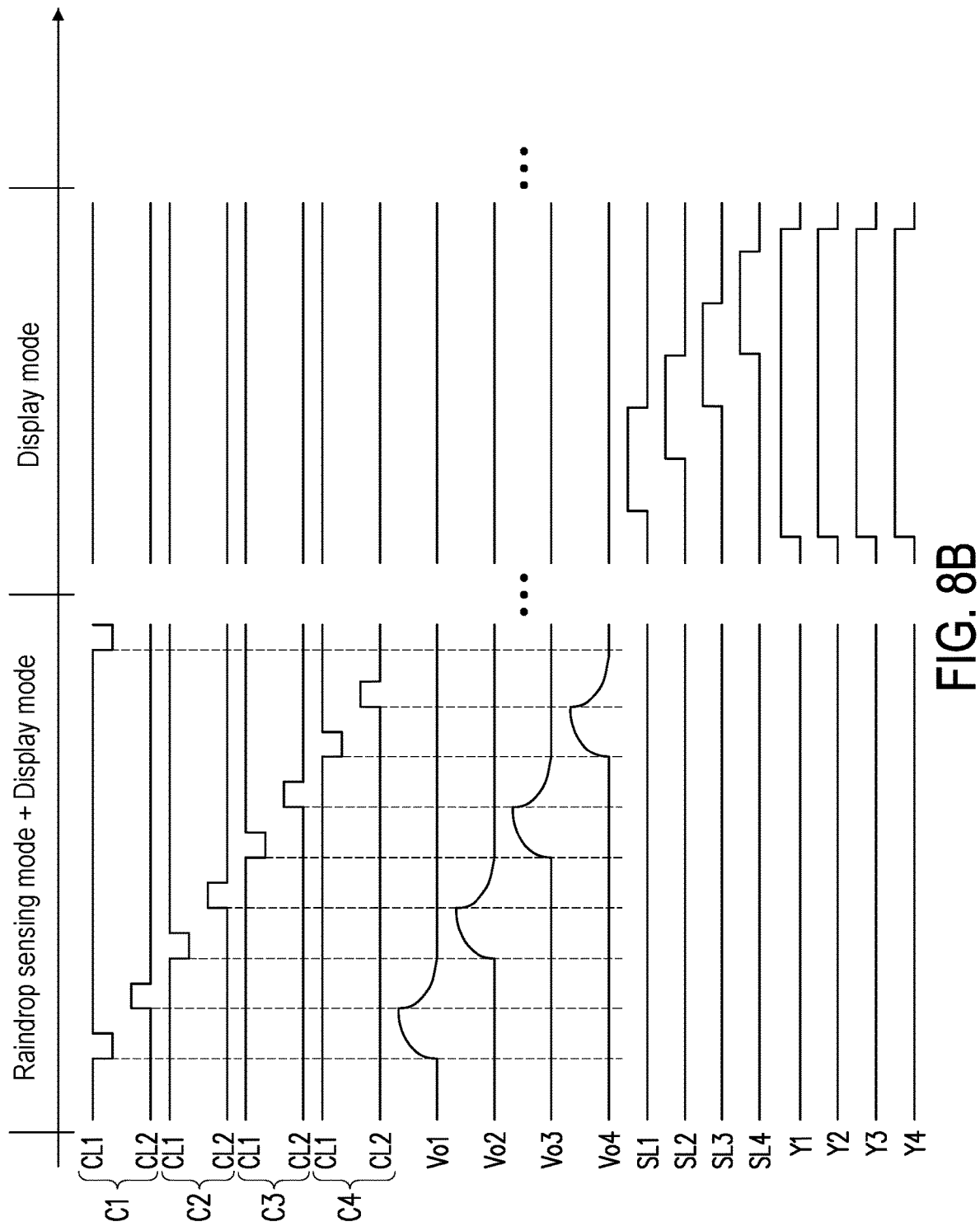
FIG. 8B is a timing view of a driving method of a raindrop sensor device according to an embodiment of the disclosure.

FIG. 8A is a schematic view of a circuit of a raindrop sensor device according to an embodiment of the disclosure. FIG. 8B is a timing view of a driving method of a raindrop sensor device according to an embodiment of the disclosure.

The raindrop sensor device corresponding to FIG. 8A and FIG. 8B is, for example, the raindrop sensor device 10e of FIG. 7.

Please refer to FIG. 7, FIG. 8A, and FIG. 8B. In the embodiment, the raindrop sensor element 200a further includes the control circuit 210 (not shown in FIG. 2). For the related description of the control circuit 210, reference may be made to the relevant paragraphs of FIG. 3A and FIG. 3A, which will not be repeated here.

In the embodiment, when executing the raindrop sensing mode of the raindrop sensor device 10e, signals of the first control line Y1, the second control line Y2, the third control line Y3, and the fourth control line Y4 are pulled down, so that the first switch element SW1, the second switch element SW2, the third switch element SW3, and the fourth switch element SW4 are in the open state (OFF) to prevent the control circuit 210 from affecting the first light emitting diode L1, the second light emitting diode L2, the third light emitting diode L3, and the fourth light emitting diode L4.

When executing the display mode of the raindrop sensor device 10e, the signals of the first control line Y1, the second control line Y2, the third control line Y3, and the fourth control line Y4 are pulled up, so that the first switch element SW1, the second switch element SW2, the third switch element SW3, and the fourth switch element SW4 are in the closed state (ON). At the same time, the switches Q1 to Q4 are disconnected, so as to prevent the control circuit 210 from affecting the first light emitting diode L1, the second light emitting diode L2, the third light emitting diode L3, and the fourth light emitting diode L4.

In the embodiment, the display mode and the raindrop sensing mode of the raindrop sensor device 10e are not executed at the same time. In other words, the display mode and the raindrop sensing mode of the raindrop sensor device 10e may be alternately executed.

What is claimed is:

1. A raindrop sensor device, comprising:
   a substrate;
   a raindrop sensor element, located on the substrate and comprising a first electrode and a second electrode separated from each other;
   a first light emitting diode, located on the substrate and electrically connected to the first electrode of the raindrop sensor element, wherein in a direction perpendicular to the substrate, the first electrode of the raindrop sensor element partially overlaps with the first light emitting diode; and
   an active element, located on the substrate and electrically connected to the first light emitting diode, wherein the first electrode and the second electrode are closer to the substrate than the active element.

2. The raindrop sensor device according to claim 1, wherein the first light emitting diode comprises:
   a semiconductor;
   a first pad, electrically connected to the semiconductor and the first electrode of the raindrop sensor element; and
   a second pad, electrically connected to the semiconductor and the active element.

3. The raindrop sensor device according to claim 2, wherein the first pad of the first light emitting diode and the first electrode of the raindrop sensor element are electrically connected to a ground signal.

4. The raindrop sensor device according to claim 2, further comprising:
   a switch element, located on the substrate, wherein a source of the switch element is electrically connected to the active element and the second pad of the first light emitting diode, and a drain of the switch element is electrically connected to the second electrode of the raindrop sensor element.

5. The raindrop sensor device according to claim 2, further comprising:
   a first insulating layer, located on the substrate, the first electrode, and the second electrode, wherein the active element is located on the first insulating layer;
   a first transfer electrode, located on the first insulating layer and electrically connected to the first electrode of the raindrop sensor element through a first through hole passing through the first insulating layer, wherein a gate insulating layer is located on the first transfer electrode and the first insulating layer;
   a second insulating layer, located on the gate insulating layer; and
   a second transfer electrode, located on the second insulating layer and electrically connected to the first transfer electrode through a second through hole passing through the second insulating layer, wherein the first pad of the first light emitting diode is electrically connected to the second transfer electrode.

6. The raindrop sensor device according to claim 5, further comprising:
   a switch element, located on the substrate, wherein a source of the switch element is electrically connected to the active element and the second pad of the first light emitting diode; and
   a third transfer electrode, located on the first insulating layer and electrically connected to the second electrode of the raindrop sensor element through a third through hole passing through the first insulating layer, wherein the gate insulating layer is located on the third transfer electrode, and a drain of the switch element is located on the second insulating layer and is electrically connected to the third transfer electrode through a fourth through hole of the second insulating layer.

7. The raindrop sensor device according to claim 1, further comprising:
   a second light emitting diode, located on the substrate and electrically connected to the first electrode of the raindrop sensor element.

8. The raindrop sensor device according to claim 7, wherein the first light emitting diode and the second light emitting diode are located in a same pixel of the raindrop sensor device.

9. The raindrop sensor device according to claim 7, wherein a size of the first electrode of the raindrop sensor element is greater than a size of the first light emitting diode and a size of the second light emitting diode.

10. The raindrop sensor device according to claim 1, further comprising:
    a second light emitting diode, located on the substrate, wherein
    the raindrop sensor element further comprises a third electrode and a fourth electrode separated from each other, and the second light emitting diode is electrically connected to the third electrode of the raindrop sensor element.

11. The raindrop sensor device according to claim 1, wherein the first light emitting diode and the raindrop sensor element are located on a same side of the substrate.

12. A driving method of a raindrop sensor device, comprising:
    providing a raindrop sensor device, wherein the raindrop sensor device comprises:

a substrate;

a raindrop sensor element, located on the substrate and comprising a first electrode and a second electrode separated from each other;

a light emitting diode, electrically connected to the first electrode of the raindrop sensor element; and an active element, electrically connected to the light emitting diode, wherein the first electrode and the second electrode are closer to the substrate than the active element;

executing a raindrop sensing mode of the raindrop sensor device, wherein the raindrop sensing mode comprises applying a first pulse signal to the raindrop sensor device; and executing a display mode of the raindrop sensor device, wherein the display mode comprises applying a second pulse signal to the active element.

13. The driving method of the raindrop sensor device according to claim 12, wherein the raindrop sensing mode and the display mode are alternately executed.

14. The driving method of the raindrop sensor device according to claim 13, further comprising:

a switch element, located on the substrate, wherein a source of the switch element is electrically connected to the active element and the second pad of the first light emitting diode, and a drain of the switch element is electrically connected to the second electrode of the raindrop sensor element.

15. The driving method of the raindrop sensor device according to claim 12, wherein the raindrop sensing mode and the display mode are simultaneously executed.

* * * * *